(12) United States Patent
Shao et al.

(10) Patent No.: US 12,369,311 B2
(45) Date of Patent: Jul. 22, 2025

(54) SEMICONDUCTOR DEVICE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Guangsu Shao, Hefei (CN); Deyuan Xiao, Hefei (CN); Yunsong Qiu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 587 days.

(21) Appl. No.: 17/836,315

(22) Filed: Jun. 9, 2022

(65) Prior Publication Data
US 2023/0059600 A1 Feb. 23, 2023

Related U.S. Application Data

(63) Continuation of application No. PCT/CN2021/129356, filed on Nov. 8, 2021.

(30) Foreign Application Priority Data

Aug. 19, 2021 (CN) .......................... 202110957060.2

(51) Int. Cl.
*H01L 27/108* (2006.01)
*H10B 12/00* (2023.01)

(52) U.S. Cl.
CPC .......... *H10B 12/34* (2023.02); *H10B 12/053* (2023.02); *H10B 12/482* (2023.02); *H10B 12/488* (2023.02)

(58) Field of Classification Search
CPC .... H10B 12/053; H10B 12/34; H10B 12/482; H10B 12/488
See application file for complete search history.

(56) References Cited

U.S. PATENT DOCUMENTS

| | | | |
|---|---|---|---|
| 7,348,628 | B2 | 3/2008 | Yoon |
| 7,781,287 | B2 | 8/2010 | Yoon |
| (Continued) | | | |

FOREIGN PATENT DOCUMENTS

| | | |
|---|---|---|
| CN | 1897305 A | 1/2007 |
| CN | 101335241 A | 12/2008 |
| (Continued) | | |

OTHER PUBLICATIONS

Supplementary European Search Report in the European application No. 21923590.0, mailed on Aug. 1, 2023. 10 pages.
(Continued)

*Primary Examiner* — Victoria K. Hall
(74) *Attorney, Agent, or Firm* — Kilpatrick Townsend & Stockton LLP

(57) ABSTRACT

A semiconductor device and a manufacturing method thereof are provided. The method includes: forming a plurality of first trenches extending in a first direction on the substrate; forming a plurality of second trenches extending in a second direction on the substrate; forming a first isolation layer in at least one of the first trenches and at least one of the second trenches, first gaps are respectively provided between the first isolation layer and sidewalls on both sides of the first trench; forming two bit lines which are parallel to each other and extend in the first direction by depositing conductive layers of a first conductive material at bottoms of the first gaps on both sides of the first trench; and (Continued)

forming word lines extending in the second direction in the first trench and the second trench, and above the conductive layers in the first trench.

15 Claims, 46 Drawing Sheets

(56) References Cited

U.S. PATENT DOCUMENTS

| | | | |
|---|---|---|---|
| 7,994,061 B2 | 8/2011 | Jung | |
| 8,053,316 B2 | 11/2011 | Kim | |
| 8,293,604 B2 | 10/2012 | Yoon | |
| 8,420,485 B2 | 4/2013 | Cho | |
| 8,440,536 B2 | 5/2013 | Jung | |
| 8,497,174 B2 | 7/2013 | Cho | |
| 8,643,098 B2 | 2/2014 | Shim | |
| 8,878,156 B2 | 11/2014 | Satoh | |
| 8,956,961 B2 | 2/2015 | Takesako | |
| 9,029,822 B2 | 5/2015 | Satoh | |
| 9,136,376 B2 | 9/2015 | Moon | |
| 10,361,206 B2 | 7/2019 | Moon | |
| 10,811,431 B1 | 10/2020 | Makala | |
| 10,892,262 B2 | 1/2021 | Moon | |
| 10,943,812 B2 | 3/2021 | Jang | |
| 10,950,608 B2 | 3/2021 | Moon | |
| 2007/0012996 A1 | 1/2007 | Yoon | |
| 2008/0124869 A1 | 5/2008 | Yoon | |
| 2009/0004813 A1 | 1/2009 | Lee | |
| 2009/0163011 A1 | 6/2009 | Jung | |
| 2010/0237405 A1 | 9/2010 | Shin | |
| 2010/0285645 A1 | 11/2010 | Yoon | |
| 2011/0101447 A1 | 5/2011 | Cho | |
| 2011/0143508 A1 | 6/2011 | Kim | |
| 2011/0256354 A1 | 10/2011 | Jung | |
| 2012/0025300 A1* | 2/2012 | Chung | H10B 12/48 257/330 |
| 2012/0094454 A1 | 4/2012 | Cho | |
| 2012/0094455 A1 | 4/2012 | Cho | |
| 2012/0146221 A1 | 6/2012 | Shim | |
| 2012/0153365 A1 | 6/2012 | Sung | |
| 2013/0049085 A1* | 2/2013 | Lin | H10B 12/053 257/296 |
| 2013/0234230 A1 | 9/2013 | Takesako | |
| 2013/0234240 A1 | 9/2013 | Moon et al. | |
| 2014/0011334 A1* | 1/2014 | Cho | H10B 12/482 438/270 |
| 2014/0061850 A1* | 3/2014 | Cho | H01L 21/764 257/506 |
| 2014/0138609 A1 | 5/2014 | Satoh et al. | |
| 2015/0348976 A1 | 12/2015 | Moon et al. | |
| 2019/0252387 A1 | 8/2019 | Moon et al. | |
| 2019/0273081 A1 | 9/2019 | Moon et al. | |
| 2020/0203215 A1 | 6/2020 | Jang et al. | |

FOREIGN PATENT DOCUMENTS

| | | |
|---|---|---|
| CN | 101847637 A | 9/2010 |
| CN | 102054820 A | 5/2011 |
| CN | 102104005 A | 6/2011 |
| CN | 102820300 A | 12/2012 |
| CN | 103531479 A | 1/2014 |
| CN | 103311249 B | 5/2017 |
| CN | 110896074 A | 3/2020 |
| CN | 110931558 A | 3/2020 |
| CN | 111354728 A | 6/2020 |
| CN | 113179666 A | 7/2021 |
| WO | 2020263339 A1 | 12/2020 |

OTHER PUBLICATIONS

International Search Report in the international application No. PCT/CN2021/129356, mailed on Apr. 2, 2022. 6 pages with English translation.

International Search Report in the international application No. PCT/CN2021/129340, mailed on Mar. 4, 2022. 5 pages with English translation.

* cited by examiner

SEMICONDUCTOR DEVICE AND MANUFACTURING METHOD THEREOF

CROSS-REFERENCE TO RELATED APPLICATIONS

This application is a continuation application of International Application No.: PCT/CN2021/129356, filed on Nov. 8, 2021, which claims priority to Chinese Patent Application No. 202110957060.2, filed on Aug. 19, 2021. The disclosures of the applications are incorporated by reference in their entirety.

BACKGROUND

With the development of the technology of chips and memories, the requirement of integration level in the semiconductor manufacturing process is getting higher and higher. In order to improve the utilization of semiconductor substrates and the integration level, semiconductor devices with vertical channel structures have been gradually applied. Transistor channels of the vertical channel structures are perpendicular to the surface of a substrate and thus can be conveniently arranged in an array. However, for the semiconductor devices with the vertical channel structures, the wiring layout and technological process need to be further optimized and improved.

SUMMARY

Embodiments of the disclosure relate to the semiconductor manufacturing technology, in particular to but not limited to a semiconductor device and a manufacturing method thereof.

In the first aspect, the embodiments of the disclosure provide a manufacturing method of a semiconductor device including a substrate, and the method includes the following operations.

A plurality of first trenches extending in a first direction are formed on the substrate.

A plurality of second trenches extending in a second direction are formed on the substrate which the first trenches are formed on, in which the first direction is perpendicular to the second direction, and a first depth of the first trenches is greater than a second depth of the second trenches.

A first isolation layer is formed in at least one of the first trenches and at least one of the second trenches, in which on a section in the second direction, first gaps are respectively provided between the first isolation layer and sidewalls of both sides of the first trench, and a depth of the first gaps is less than the first depth.

Two bit lines which are parallel to each other and extend in the first direction are formed by depositing conductive layers of a first conductive material at bottoms of the first gaps on both sides of the first trench.

Word lines extending in the second direction are formed in the first trench and the second trench, and above the conductive layers in the first trench.

In a second aspect, the embodiments of the disclosure provide a semiconductor device including a substrate; a plurality of first trenches extending in a first direction and a plurality of second trenches extending in a second direction on the substrate, in which the first direction is perpendicular to the second direction, and a first depth of the first trenches is greater than a second depth of the second trenches; a first isolation layer located in at least one of the first trenches and at least one of the second trenches, in which on a section in the second direction, first gaps are respectively provided between the first isolation layer and sidewalls on both sides of the first trench, and a depth of the first gaps is less than the first depth; conductive layers of a first conductive material deposited at the bottoms of the first gaps on both sides of the first trench, in which the conductive layers constitute two bit lines which are parallel to each other and extend in the first direction; and word lines extending in the second direction in the first trench and the second trench, and above the conductive layers provided in the first trench.

DETAILED DESCRIPTION

For ease of understanding the disclosure, a more complete description of the disclosure will be provided below with reference to the associated drawings. Preferred embodiments of the disclosure are shown in the accompanying drawings. However, the disclosure can be realized in many different ways, and is not limited to the embodiments described in the disclosure. On the contrary, the purpose of providing the embodiments is to make the disclosure more thorough and comprehensive.

Unless otherwise defined, all technical and scientific terms used herein have the same meanings as those commonly understood by those skilled in the field pertaining to the disclosure. The terms used in the description of this disclosure are for the purpose of describing specific embodiments only and are not intended to limit this disclosure. The term "and/or" as used herein includes any and all combinations of one or more related listed items.

Figure 1:
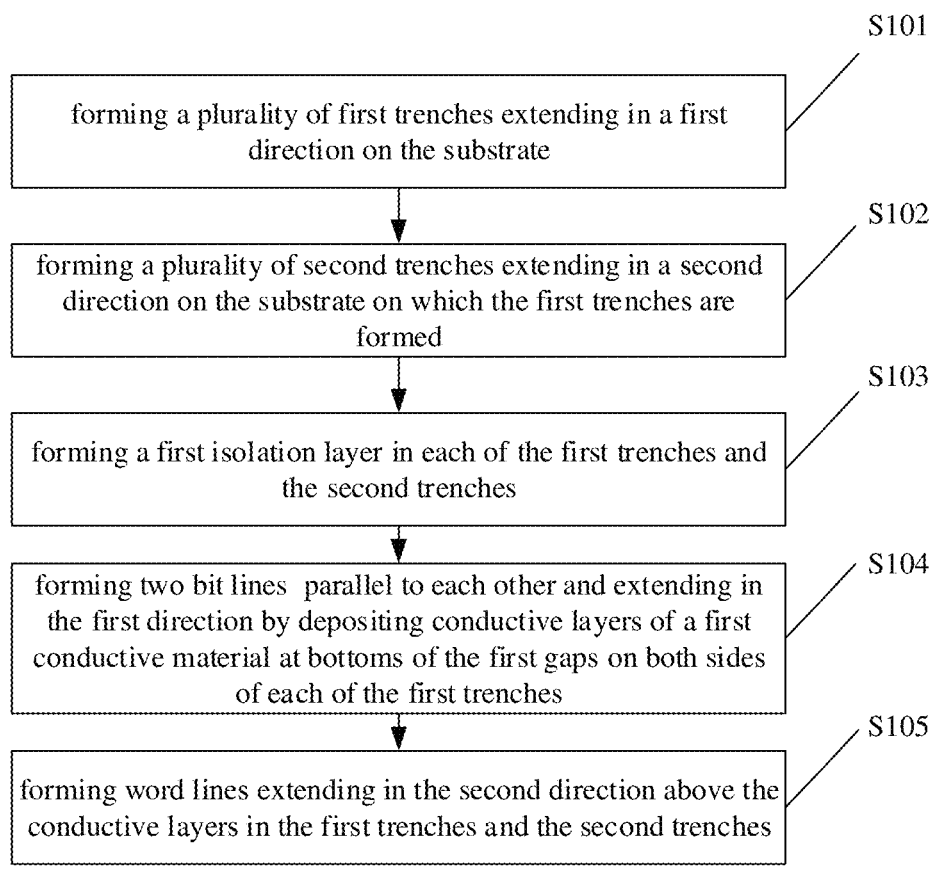
FIG. 1 is a flow chart of a manufacturing method of a semiconductor device provided by embodiments of the disclosure.

As shown in FIG. 1, an embodiment of the disclosure provides a manufacturing method of a semiconductor device, in which the semiconductor device includes a substrate. The method includes the following operations.

S101, a plurality of first trenches extending in a first direction are formed on the substrate.

S102, a plurality of second trenches extending in a second direction are formed on the substrate having the first trenches, in which the first direction is perpendicular to the second direction, and a first depth of the first trenches is greater than a second depth of the second trenches.

S103, a first isolation layer is formed in at least one of the first trenches and at least one of the second trenches, in which on a section along the second direction, first gaps are respectively provided between the first isolation layer and sidewalls of both sides of the first trench, and a depth of the first gaps is less than the first depth.

S104, two bit lines which are parallel to each other and extend in the first direction are formed by depositing a conductive layer of a first conductive material at bottoms of the first gaps on both sides of the first trench.

S105, word lines extending in the second direction are formed above the conductive layer in the first trench and the second trench.

In the embodiment of the disclosure, the trenches having a pattern can be formed on the surface of the substrate by etching. Here, the first direction is a direction extending parallel to the surface of the substrate, and a plurality of first trenches parallel to each other are formed along this direction. For example, a plurality of the first trenches are parallel to each other and may have equal spacing, depth and width. Therefore, these first trenches may be formed synchronously by etching. Of course, the etching may be a single etch or multiple etches.

Figure 2A:
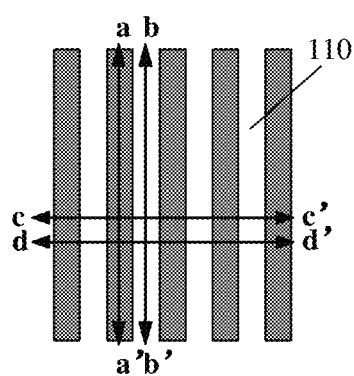
FIGS. 2A to 2E are top views and cross-sectional views of first trenches formed in a manufacturing method provided by an embodiment of the disclosure.
Figure 2B:
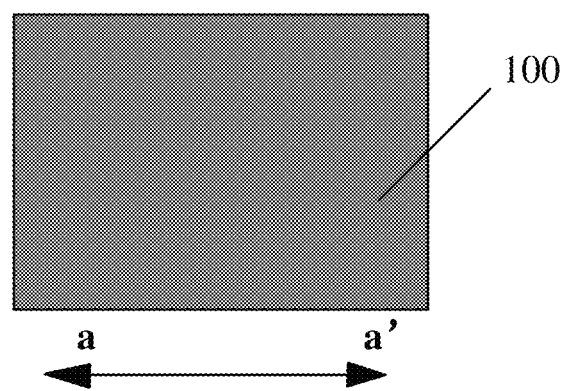
Figure 2C:
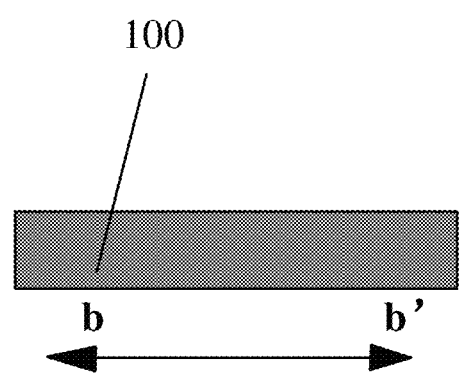
Figure 2D:
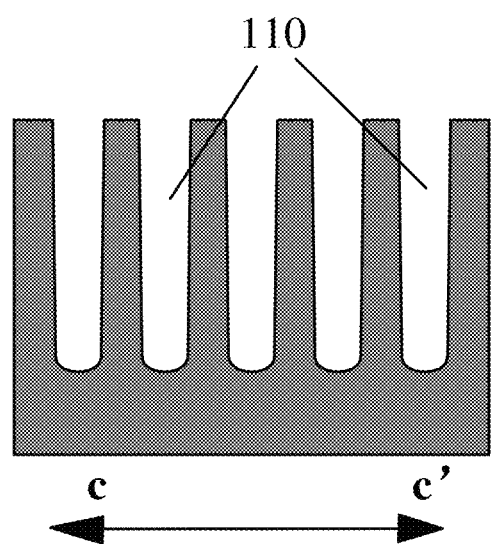
Figure 2E:
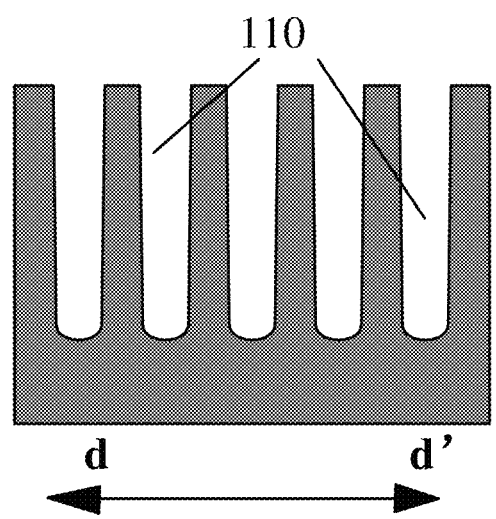

A top view after the first trenches are formed shown in FIG. 2A, and FIG. 2B, FIG. 2C, FIG. 2D and FIG. 2E are sectional views of FIG. 2A on an aa' section, a bb' section, a cc' section and a dd' section, respectively, and a plurality of the first trenches 110 distributed in parallel are formed on the substrate 100.

After the first trenches are formed, the second trenches perpendicular to the first trenches distribution can be formed also by etching. The extension direction of the second trenches is also parallel to the substrate surface, but perpendicular to the first direction. In this way, a network structure, that is, multiple first trenches and multiple second trenches interlaced with each other, can be formed on the surface of the substrate. The un-etched areas form semiconductor pillars perpendicular to the substrate surface, which can be used as vertical channels of transistors, and then form transistor arrays.

In the embodiments of the disclosure, a first isolation layer is formed in each of the first trenches and the second trenches, and the first isolation layer is composed of an insulating material, such as an oxide, a nitride, other organic material, or the like. Since the first depth of the first trenches is greater than the second depth of the second trenches, the thickness of the first isolation layer in the first trenches is also different from the thickness of the first isolation layer in the second trenches.

There are first gaps between a first isolation layer in each first trench and the sidewalls on both sides of the first trench. For the shallower second depth of the second trenches, the first gaps cannot extend into the second trenches. A first conductive material is then deposited at the bottoms of the first gaps so that the conductive layers formed by the first conductive material extend along the sidewalls on both sides of each of the first trenches to form two bit lines. The bottom of each first trench has two bit lines, thereby forming a double-bit line structure of the semiconductor device. It should be noted that the first conductive material may be a metal material, a doped semiconductor material or other conductive material. For example, the first conductive material may be copper, tungsten or the like.

Since the first gaps do not extend into the second trenches, the word lines can be formed on the conductive layers of the first trenches and in the second trenches. In fact, the word lines may extend along the second trenches, that is, in the second direction. However, since a part of the material forming the word lines may be located in the first trenches, the material needs to be formed in the first trenches and the second trenches. Of course, two adjacent word lines can be isolated by an insulating material.

Thus, for a semiconductor device with vertical channels, the embodiments of the disclosure provide an approach in which word lines and bit lines are buried in the substrate, and the channel of each transistor has a double-bit line structure, that is, both sides of the channel have conductive layers formed by depositing the conductive material. In this way, on one hand, compared with bit lines formed by doping the semiconductor substrate, the bit lines formed by depositing the conductive material adopted in the embodiments of the disclosure have higher conductivity, so that the overall performance of the semiconductor device can be improved. On the other hand, the integration level of the semiconductor device can be improved and the parasitic capacitance between bit lines can be reduced by forming a parallel double-bit line structure in the first gaps on both sidewalls of each of the first trenches.

In some embodiments, forming a plurality of second trenches extending in the second direction on the substrate on which the first trenches are formed includes the following operations.

A first insulating layer is formed by covering a first insulating material on a surface of the substrate, in which, the first insulating layer covers the inner walls of the first trenches.

A second insulating layer is formed by filling a second insulating material into each of the first trenches.

Multiple second trenches extending in the second direction are formed on the substrate.

In the embodiments of the disclosure, after the first trenches are formed, the first insulating material may cover the surface of a substrate by epitaxial growth or deposition, for example, by chemical vapor deposition (CVD), atomic layer deposition (ALD), physical vapor deposition (PVD) or the like. Here the first insulating material may be an oxide, a nitride, other insulating material or the like. The first insulating material may cover the entire inner walls of the first trenches, including the bottoms and sidewalls of the first trenches. In addition, the area of the substrate surface other than the first trenches is also covered with the first insulating material.

Figure 3A:
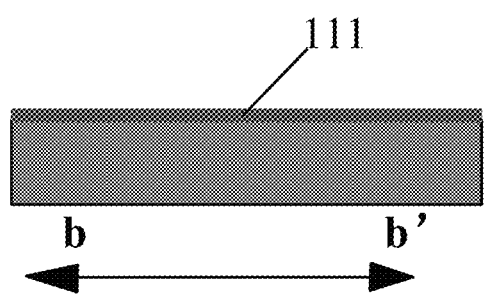
FIGS. 3A to 3C are cross-sectional views of the first trenches covered by a first insulating layer in a manufacturing method provided by an embodiment of the disclosure.
Figure 3B:
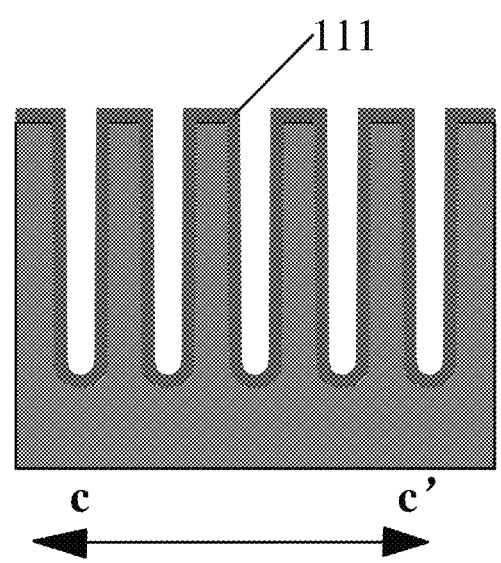
Figure 3C:
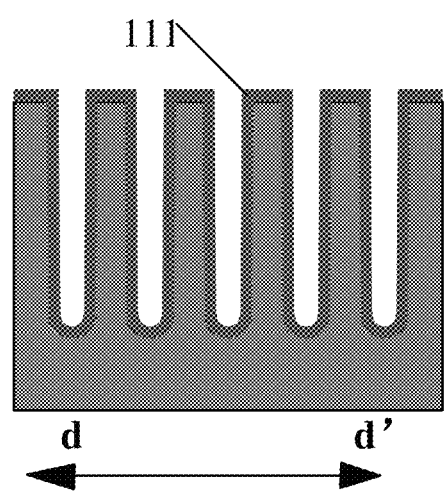

FIGS. 3A to 3C are cross-sectional views of corresponding positions of bb' section, cc' section and dd' section after covering with the first insulating material. As shown in FIGS. 3A to 3C, the entire surface of the substrate 100 and the inner surface of the first trenches 110 are covered with the first insulating material to form the first insulating layer 111.

Figure 4A:
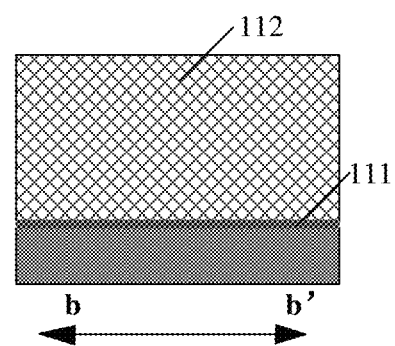
FIGS. 4A to 4C are cross-sectional views of the first trenches covered by a second insulating layer in a manufacturing method provided by an embodiment of the disclosure.
Figure 4B:
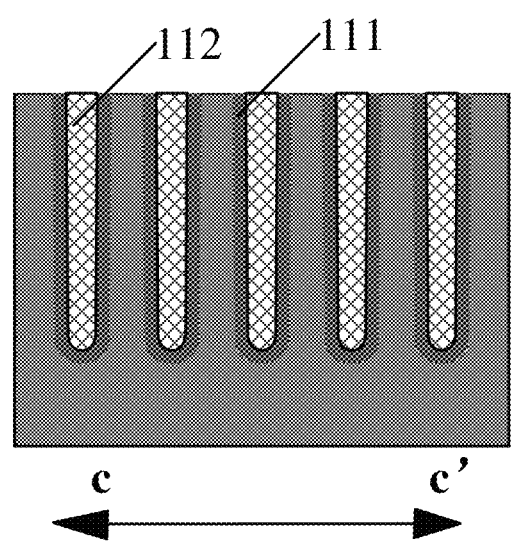
Figure 4C:
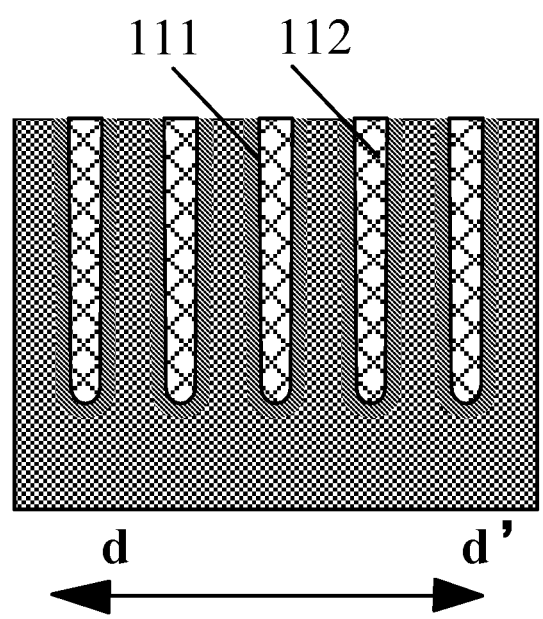

The second insulating material may then be filled within the first trenches such that all of the first trenches are filled up. FIGS. 4A to 4C are cross-sectional views of corresponding positions of bb' section, cc' section and dd' section after the second insulating material are filled. As shown in FIGS. 4A to 4C, the second insulating layer 112 is filled in each of the first trenches and on the first insulating layer 111. The second insulating material is an insulating material different from the first insulating material, for example, if the first insulating material is silicon nitride (SiN), the second insulating material may be silicon oxide (SiO). At this time, some planarization processing such as polishing can be performed, so that the surface of the substrate and the surface of the second insulating material form a flat plane. The planarization process may remove the first insulating material on the surface of the substrate, or may retain part of the first insulating material on the surface of the substrate at this time.

At this time, further etching can be performed on the plane to form multiple second trenches extending in the second direction. It should be noted that the etching process needs to act on the silicon material of the substrate and the insulating material filled in the first trenches synchronously, so that complete second trenches can be formed. From a view of the section in the extension direction of the first trenches, multiple adjacent recessed areas are formed on the second insulating material in each first trench.

Figure 5A:
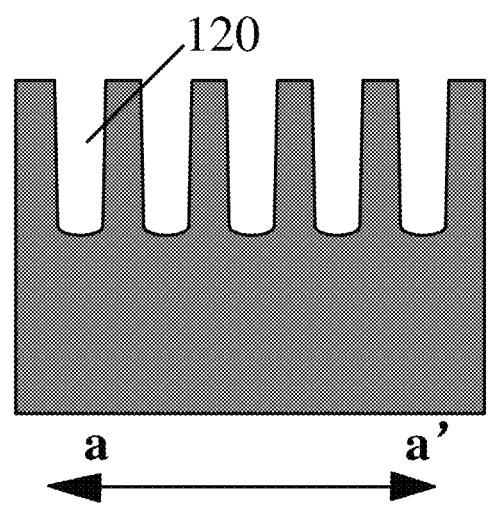
FIGS. 5A to 5C are cross-sectional views of second trenches formed in a manufacturing method provided by an embodiment of the disclosure.
Figure 5B:
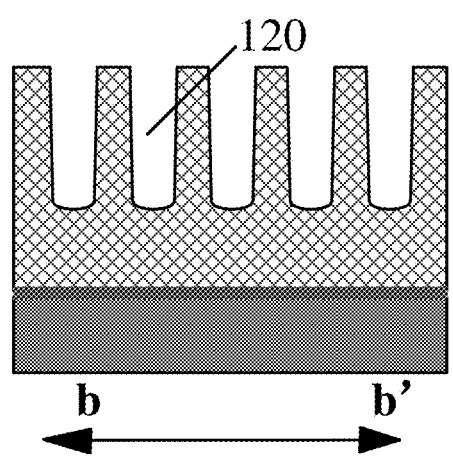
Figure 5C:
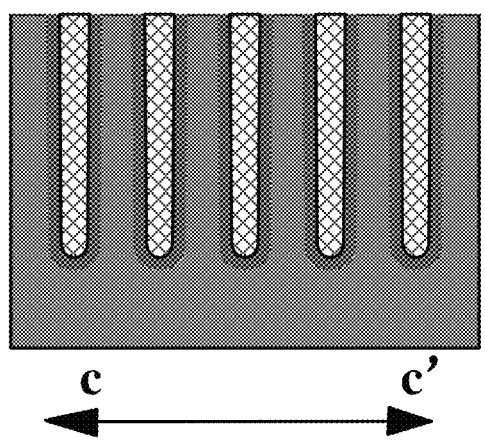
Figure 6A:
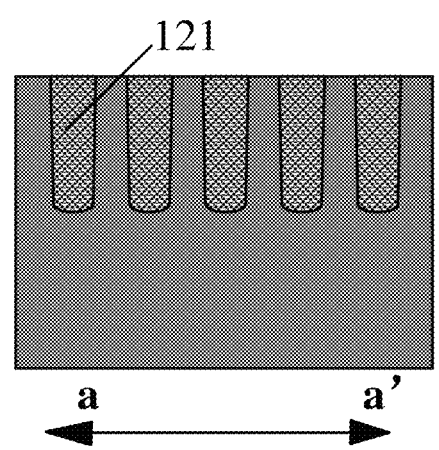
FIGS. 6A to 6D are cross-sectional views of the second trenches filled with the first insulating layer in a manufacturing method provided by an embodiment of the disclosure.
Figure 6B:
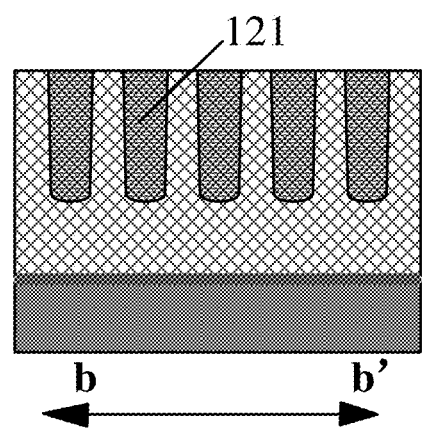
Figure 6C:
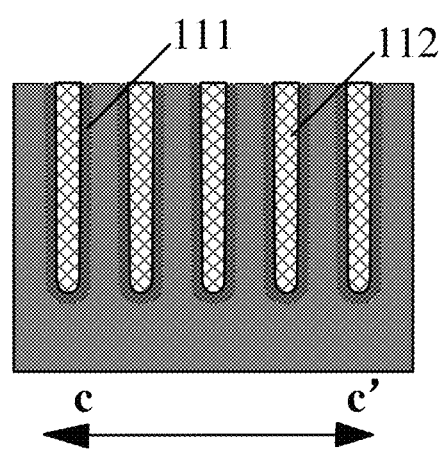
Figure 6D:
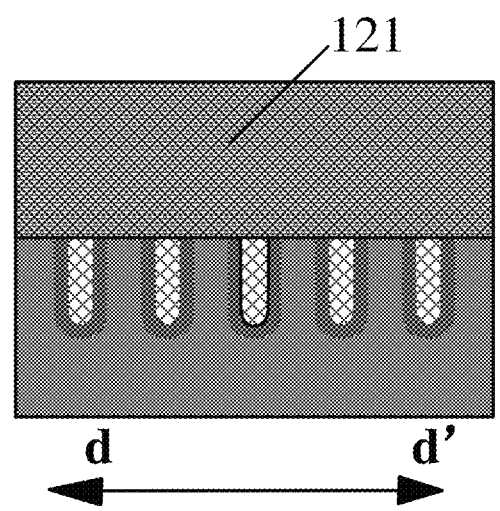

Cross-sectional views on the aa' section, bb' section, cc' section, after forming the second trenches 120 are shown in FIGS. 5A to 5C. Since the depth of the second trenches 120 is smaller than that of the first trenches 110, the shape of the bottoms of the first trenches 110 and the first insulating layers 111 and the second insulating layers 112 can still be seen in the dd' section along the second trenches 120 as shown in FIG. 6D.

Of course, if the insulating material filled in the first trenches were removed, the first trenches and the second trenches would be two sets of linear trenches perpendicular to each other, and each first trench and each second trench have a common area at the intersection. As a whole, the first trenches and the second trenches form a network structure, and the un-etched substrate areas are semiconductor pillars in a direction perpendicular to the surface of the substrate.

In the embodiment of the disclosure, the first depth of the first trenches is greater than the second depth of the second trenches, so that after the formation of the second trenches, a part of the first insulating layer and a part of the second insulating layer extending in the first direction remain at the bottoms of the first trenches.

Thus, under the protection of the first insulating layer and the second insulating layer, the second trenches can be formed after the first trenches are formed, so that the first trenches and the second trenches have different depths, and the inner walls of the first trenches may not be damaged during the formation of the second trenches.

In some embodiments, forming the first isolation layer within each of the first trenches and the second trenches includes the following operations.

The first insulating material is filled in each of the second trenches.

Part of the first insulating material in each of the first trenches and the second trenches are removed synchronously to a position with a depth less than a third depth to form the first gaps, in which the third depth is less than the first depth and greater than the second depth, and the remaining first insulating layer and the second insulating layer in each of the first trenches and the second trenches is the first isolation layer.

Here, the first isolation layer includes a structure composed of a portion of the first insulating material and a portion of the second insulating material, including the insulating materials at the bottom of the first trench, and the insulating materials not etched away in the first trench when forming the second trench.

There are first gaps between the first insulating material in each of the first trenches and the sidewalls on both sides of the first trench, and in at least part of each first gap is deposited by the conductive material to form a conductive layer. Since the first gaps extend in the first direction along the sidewalls of the first trenches, the conductive layers are conductive lines covering at least a partial area of the sidewalls of the first trenches and extending in the first direction. Since both sides of each first trench are provided with the first gaps, two conductive lines can be formed. Thus, for the transistor array in the semiconductor device, each column of the transistors has two bit lines, that is, a double-bit line structure buried inside the substrate.

The buried double-bit line structure formed by depositing a conductive material in the first gaps has a simple process and is beneficial to the design of a highly integrated semiconductor device.

In some embodiments, after filling the first insulating material in the second trenches, the method further includes the following operations.

The first insulating material is removed to a position with a fourth depth to form recessed areas, and the fourth depth is less than the second depth.

The second insulating material covers the sidewalls of the recessed areas to form protective layers, in which the first gaps formed after removing the first insulating material are located, in a direction perpendicular to the substrate surface, between the protective layers and the remaining first insulating layers.

After the first insulating material is filled in the second trenches, the first trenches and the second trenches are filled with insulating material. Cross-sectional views on the aa' section, bb' section, cc' section, and dd' cross-section after filling the first insulating material are shown in FIGS. 6A to 6D. As shown in FIGS. 6C to 6D, the first insulating layers 111 covering the sidewalls and the second insulating layers 112 filled in the first trenches can be seen in the first trenches 110. The second trenches 120 in FIGS. 6A and 6B are filled with the insulating layers 121 of the first insulating material.

Then as shown in FIGS. 7A to 7D, the recessed areas 130 may be formed within the first trenches 110 and the second trenches 120 by etching back part of the first insulating material. It should be noted that, the removal of the first insulating material here does not affect the second insulating material, so that the second insulating material remains flush with the tops of the first trenches, while the first insulating material on the sidewalls of the first trenches is partially removed to form the recessed areas with the fourth depth. The second trenches are filled with a first insulating material, so that the second trenches are sunken with the fourth depth.

The recessed areas are then covered with the second insulating material, such that the second insulating material in the first trenches fills up the first trenches at the tops.

Figure 7A:
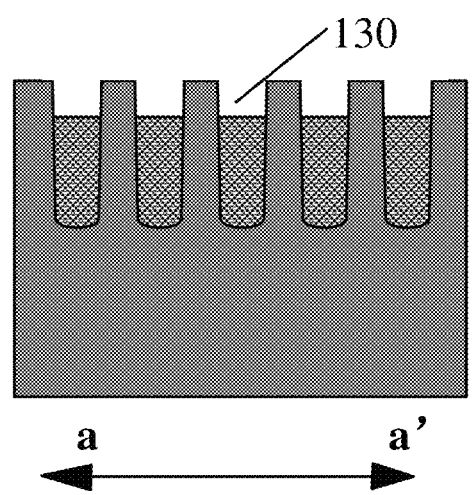
FIGS. 7A to 7D are cross-sectional views of recessed areas formed in a manufacturing method provided by an embodiment of the disclosure.
Figure 7B:
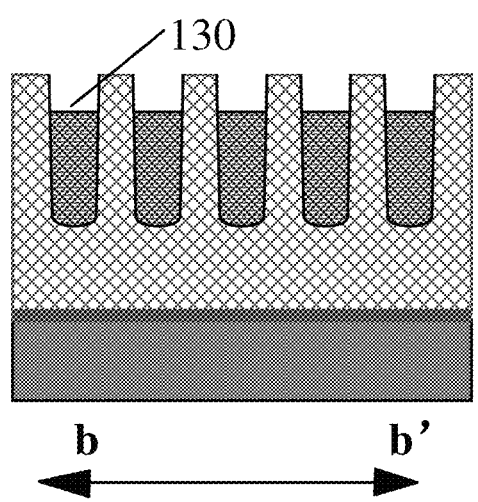
Figure 7C:
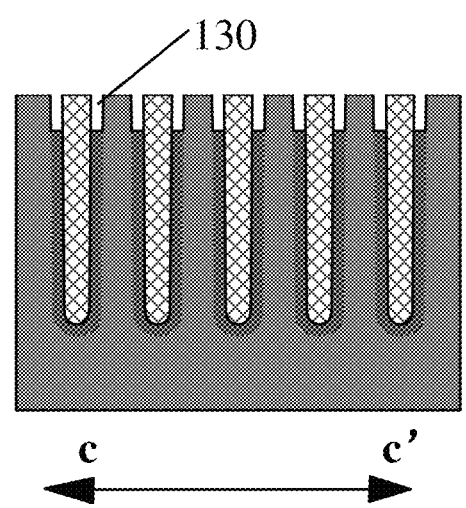
Figure 7D:
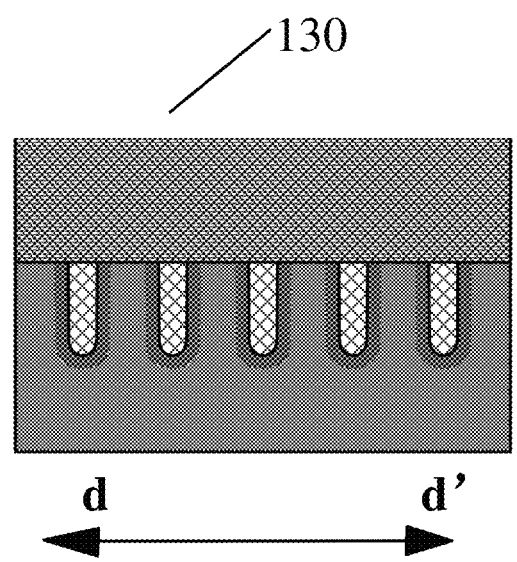
Figure 8A:
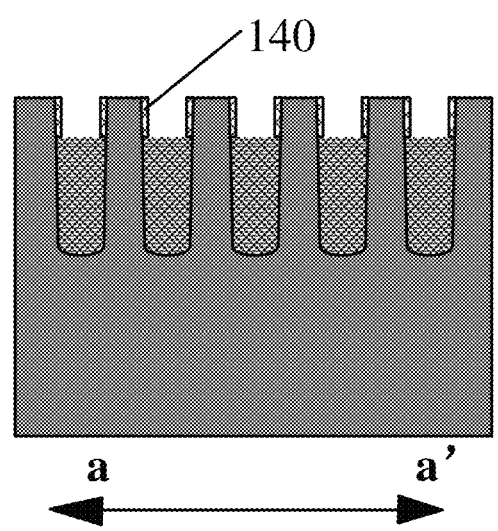
FIGS. 8A to 8C are cross-sectional views of the recessed areas formed with protective layers in a manufacturing method provided by an embodiment of the disclosure.
Figure 8B:
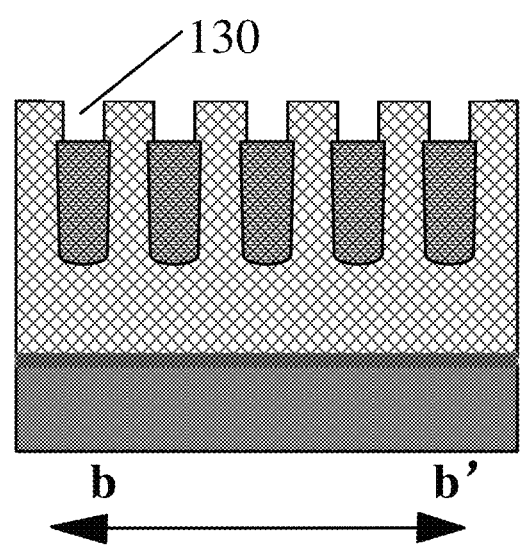
Figure 8C:
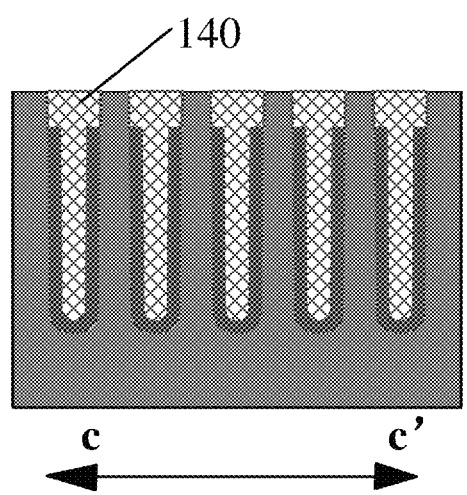
Figure 9A:
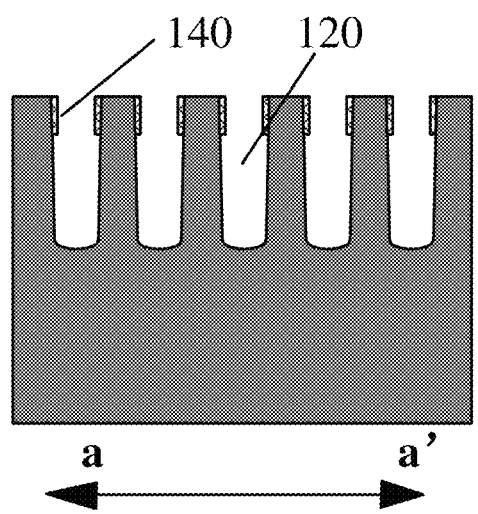
FIGS. 9A to 9D are cross-sectional views of first gaps formed in a manufacturing method provided by an embodiment of the disclosure.
Figure 9B:
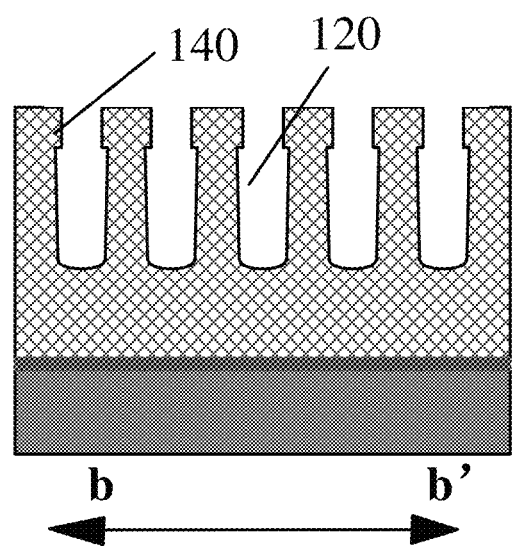
Figure 9C:
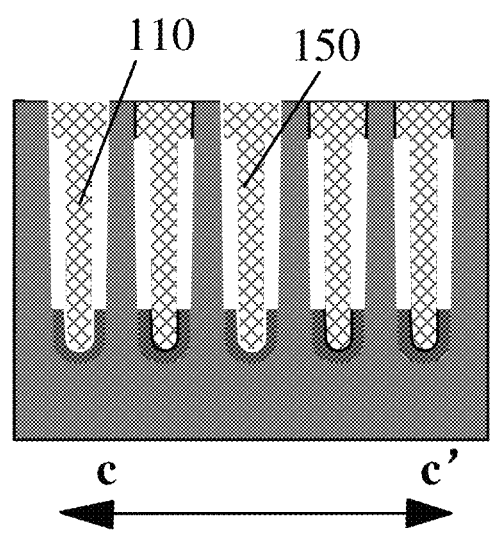
Figure 9D:
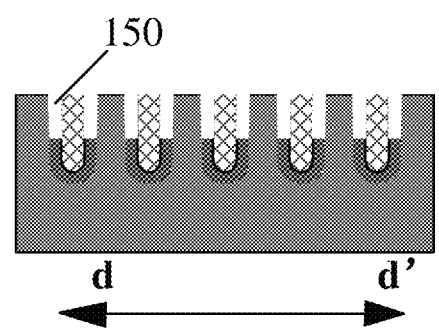

FIGS. 8A to 8C are cross-sectional views on aa' section, bb' section and cc' section, and the dd' section is unchanged compared to FIG. 7D. The second insulating material is formed on the inner walls of the recess areas 130 in the second trenches 120. Thus, the protective layers 140 are formed in the areas on the tops of the first trenches 110 and the second trenches 120. In the cross-section shown in FIG. 8B, the protective layers 140 are integrated with the second insulating material in the original first trenches, so that the width of the recessed areas 130 in the view of this cross-section is reduced. The dd' section does not change compared to FIG. 7D which may be referred to.

Exemplarily, a layer of silicon oxide can be grown in the recessed areas by ALD method, and then back etching can be carried out again to remove the silicon oxide at the bottoms of the recessed areas in the second trenches, so that the first insulating material (such as silicon nitride) is exposed.

In this way, the tops of the first trenches are sealed by the second insulating material, and the surfaces of the first insulating material are exposed in the second trenches, thus forming the protective layers. At this time as shown in FIGS. 9A to 9D, the first insulating material is etched and the second insulating material is retained. At this time, the protective layers 140 are retained at the top areas of the first trenches 110 and the second trenches 120, while the lower parts are hollowed out, so that the first gaps 150 can be formed in the portions of the sidewalls of the first trenches 110 covered with the first insulating material.

In some embodiments, synchronously removing the first insulating material to a position with a depth less than the third depth within the first trenches and the second trenches to form the first gaps includes the following operation.

The first insulating material is removed by wet etching to form the first gaps.

The process for forming the first gaps may be wet etching, and clean the first insulating material, with the etching depth smaller than the third depth. In this way, the first insulating material in the second trenches is removed, and a part of the first insulating material on both sides of the first isolation layer in each of the first trenches is removed, leaving only the first insulating layers at the bottoms deeper than the third depth, thereby forming the first gaps on the sidewalls of the first trenches.

In some embodiments, the first insulating material includes a silicon nitride material, and the etching solution used in the wet etching includes a phosphoric acid solution.

When the first insulating material is a silicon nitride material, the phosphoric acid solution can cause corrosion to the first insulating material, thereby removing the first insulating material, but the phosphoric acid solution does not cause corrosion to oxides such as silicon oxide. Therefore, the second insulating material may be an oxide.

In some embodiments, forming the first insulating layer by covering the first insulating material on the surface of the substrate includes the following operation.

The first insulating material is deposited on the surface of the substrate by an atomic layer deposition to form the first insulating layer.

The thickness of the first insulating layer formed by ALD is uniform, so that the first gaps formed after removing part of the first insulating material also has a uniform width.

In this way, the conductive material deposited in the first gaps can form uniform bit lines, thereby reducing the impedance of the bit lines and improving the conductive performance.

In some embodiments, after filling the second insulating material in the first trenches to form the second insulating layers, the method further includes the following operation.

The second insulating layers and the first insulating layer on the substrate surface are planarized to expose the substrate surface in areas other than the first trenches and the second trenches.

In the embodiment of the disclosure, after the first trenches are filled with the insulating material to form the second insulating layers, part of the excess insulating material may cover the tops of the semiconductor pillars, thereby affecting the performance of the semiconductor device. Therefore, the planarization process can be performed by chemical mechanical polishing (CMP).

In some embodiments, two bit lines parallel to each other and extending in the first direction are formed, in which the conductive layers of the first conductive material are deposited at the bottoms of the first gaps on both sides of each first trench, which includes the following operations.

The first conductive material is filled in the first gaps.

Part of the first conductive material is removed in the first gaps, and the first conductive material retained at the bottoms of the first gaps form the bit lines, in which, the first conductive material at the bottoms constitutes the conductive layers.

By the processes in the above embodiments, the first gaps can be formed between each first isolation layer and the sidewalls of each of the first trenches, and then the first conductive material such as metallic materials such as copper, tungsten, doped semiconductor materials or other conductive materials can be filled in the first gaps by a deposition process.

Figure 10A:
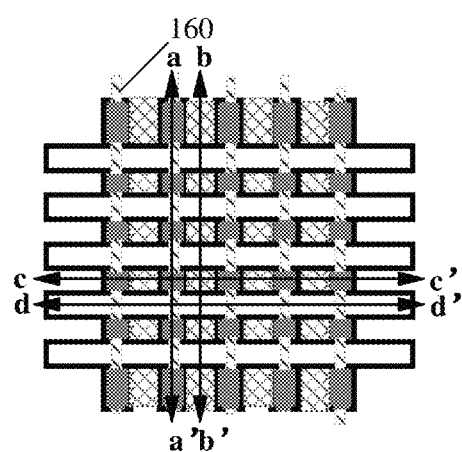
FIGS. 10A to 10C are top views and cross-sectional views after bit lines are formed in the first gaps in a manufacturing method provided by an embodiments of the disclosure.
Figure 10B:
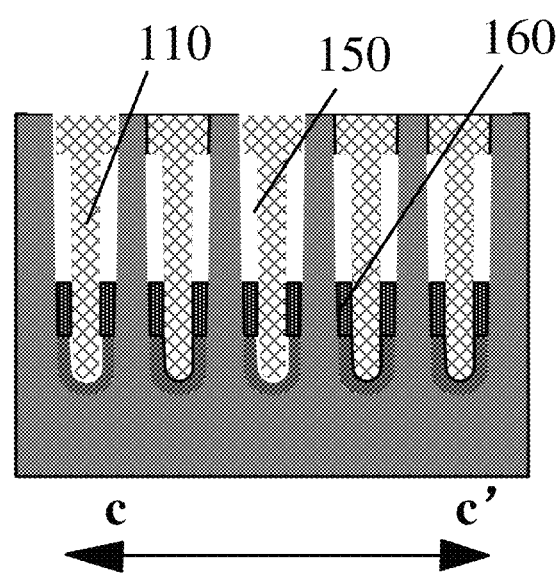
Figure 10C:
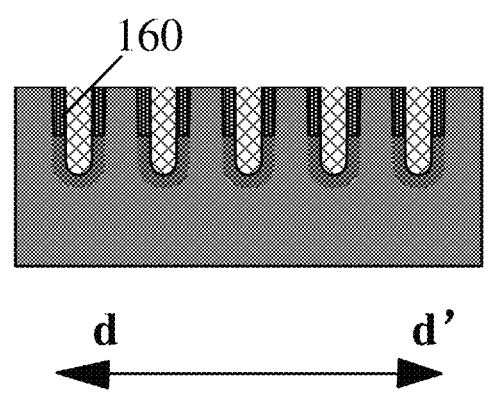
Figure 11A:
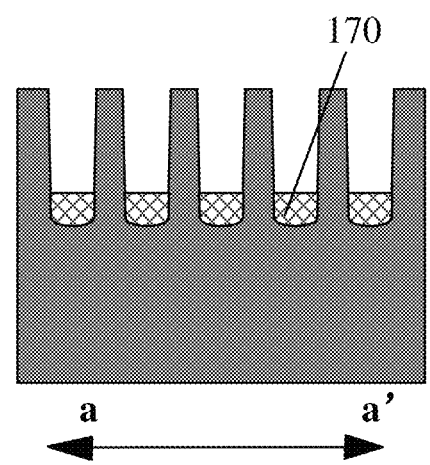
FIGS. 11A to 11D are cross-sectional views of a second isolation layer formed in a manufacturing method provided by an embodiment of the disclosure.
Figure 11B:
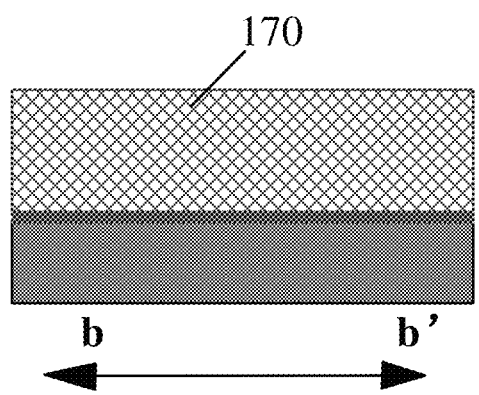
Figure 11C:
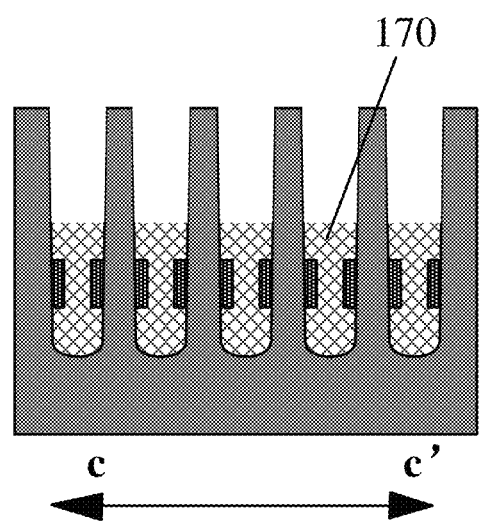
Figure 11D:
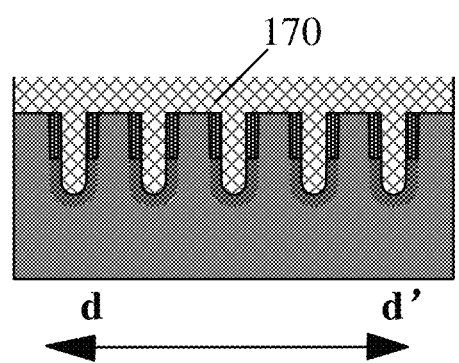
Figure 12A:
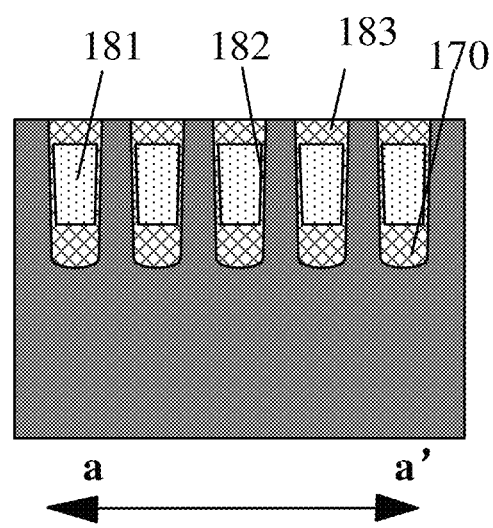
FIGS. 12A to 12D are cross-sectional views of gate conductive layers formed in a manufacturing method provided by an embodiment of the disclosure.
Figure 12B:
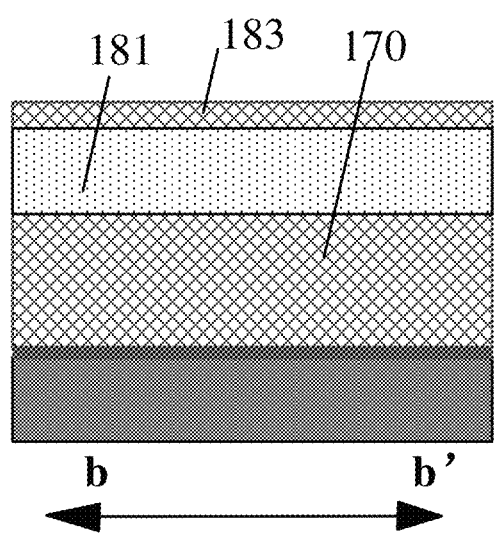
Figure 12C:
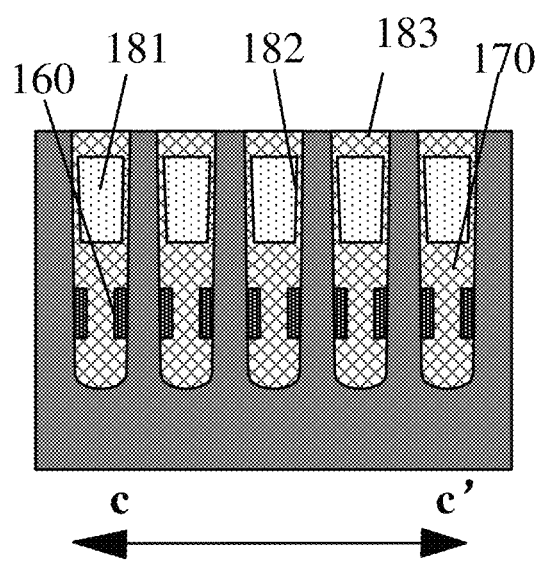
Figure 12D:
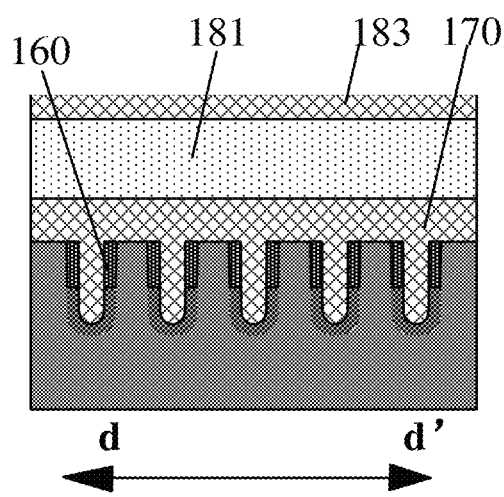
Figure 13A:
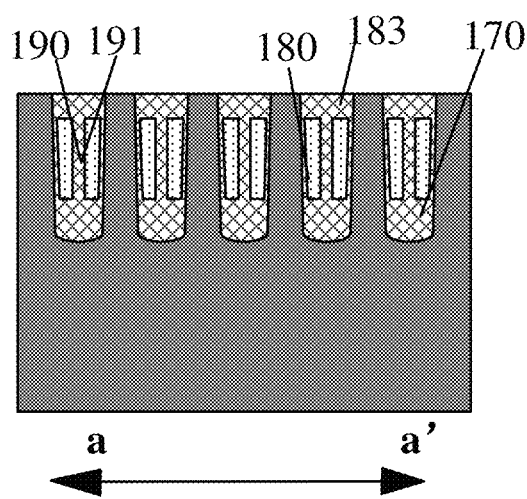
FIGS. 13A to 13D are cross-sectional views of word lines formed in a manufacturing method provided by an embodiment of the disclosure.
Figure 13B:
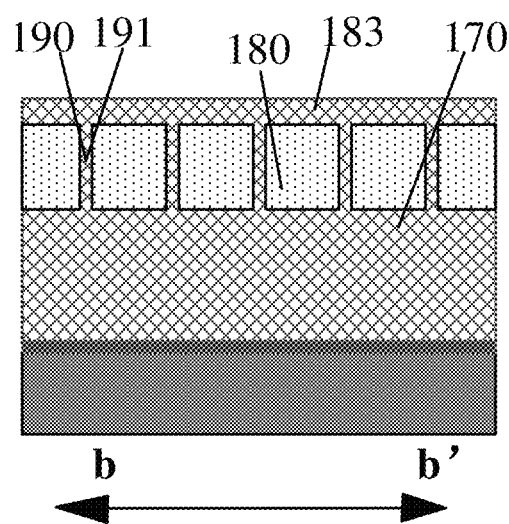
Figure 13C:
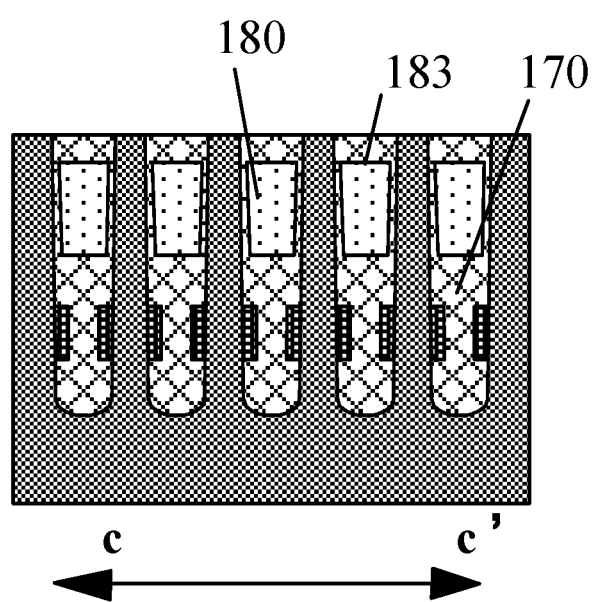
Figure 13D:
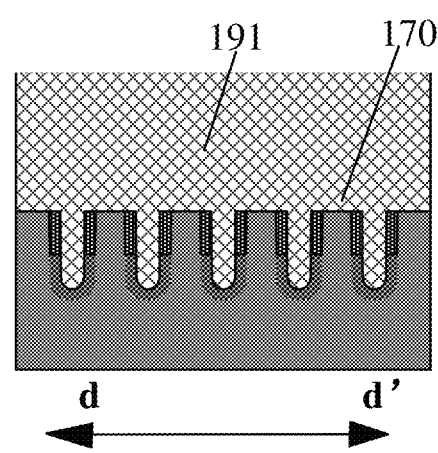

FIG. 10A is a top view and FIGS. 10B and 10C are cross-sectional views on cc' section and dd' section after the bit lines are formed. From a view of the aa' section and the bb' section, the bit lines formed of the conductive material are not visible and therefore the views are unchanged, and may be referred to FIGS. 9A and 9B, while the bit lines 160 formed of the conductive material can be seen at the bottoms of the first trenches as shown in FIGS. 10B and 10C.

Since the bit lines extend in the direction along the first trenches, and the structures within the second trenches are not affected by the bit lines. Therefore, the bit lines only need to be formed in the part of a first trench that is deeper than a second trench. That is to say, each of the conductive layers to be formed for forming a bit line may only cover a partial area near to the bottom of each of the first trenches, that is, a thin line may be formed. Therefore, a portion of the first conductive material in the first gaps can be removed, and only the first conductive material at the bottoms of the first gaps is retained, thereby forming the bit lines.

In some embodiments, forming the word lines along the second direction above the conductive layers in the first trenches and the second trenches includes the following operations.

Part of the first isolation layer in each of the first trenches and the second trenches above the conductive layers are removed to form a third trench.

A second isolation layer at a bottom of the third trench is formed, in which, a bottom of the second isolation layer is connected with the remaining first isolation layer between the two bit lines in each of the first trenches, and the top of the second isolation layer is lower than the surface of the substrate other than the areas of the first trenches and the second trenches.

A word line is formed in each of the third trenches above the second isolation layer.

After the bit lines are formed, the first trenches are still filled with the first isolation layers and the protective layers, and the word lines need to be formed along the direction of the second trenches. Therefore, part of the first isolation layers and the protective layers need to be removed, so that the third trenches are formed in the first trenches and the second trenches. For example, the bottoms of the third trenches still retain part of the second insulating material that can be used as the second isolation layers.

In an embodiment, as shown in FIGS. 11A to 11D, the second insulating material in each of the first trenches 110 and the second trenches 120 can be removed in the process of removing part of each of the first insulating layers, and then a layer of the first insulating material can formed in each of the first trenches 110 and the second trenches 120 to cover the already formed bit lines, thereby forming the second isolation layer 170. To form the second isolation layers 170, the first insulating material can be filled in the trenches to their tops, and then the whole layers are etched back to a certain depth, and the remaining first insulating material is the second isolation layers. In an embodiment, all the insulating materials in the first trenches and the second trenches, including the first insulating material and the second insulating material, can be removed, and then an insulating material, either the first insulating material or the second insulating material, is filled back to form the second insulating layers. Here, the first insulating material may be silicon oxide, and the sidewalls of each third trench may also be covered with a layer of silicon oxide, which can be used as a gate oxide layer.

In this way, the formed bit lines are buried between the substrate and the insulating material without being exposed. At this time, word lines can be further formed in the third trenches.

In some embodiments, forming the word line in each of the third trenches above the second isolation layer includes the following operations.

Gate oxide layers are formed on the sidewalls of the first trenches and the second trenches above the second isolation layer.

A second conductive material is filled between adjacent gate oxide layers to form gate conductive layers.

Fourth trenches on the second conductive material are formed along the second direction, in which the fourth trenches separate the gate conductive layers in a section in the first direction;

The first insulating material is filled in the fourth trenches to form third isolation layers; each of the gate conductive layers connected by the second conductive material on both sides of each of the third isolation layers constitutes the word line.

Each word line is essentially formed by connecting the gates in a straight line, in which each of the gates surrounds a vertical channel constituted by a semiconductor pillar, and each of the gates includes a gate oxide layer and a gate conductive layer. Thus, during forming the gate oxide layers, the gate oxide layers may be formed on the sidewalls of the regions above the second isolation layers (that is, the entire third trenches) in the first trenches and the second trenches, so that the gate oxide layers surround and cover the sidewalls of the semiconductor pillars.

The process for forming the gate oxide layers may be the ALD process to deposit a layer of silicon oxide, alternatively, may be oxidation of the sidewalls of the semiconductor pillars, to oxidize the surfaces of the sidewalls of the semiconductor pillars to a uniform layer of silicon oxide.

Then, the second conductive material can be filled between the gate oxide layers, that is, in the third trenches after the sidewalls are covered with the gate oxide layers, to form the gate conductive layers. The second conductive material may be a metallic material, such as copper, tungsten or the like. As shown in FIGS. 12A to 12D, the gate conductive layers 181 made of the metallic material are located between the gate oxide layers 182 and on the second isolation layers 170. The tops of the gate conductive layers 181 may be covered with the second insulating material to form gate protective layers 183. In this way, the gate electrodes are also buried in the substrate and not exposed on the substrate surface.

In addition, since the conductive material deposited in the third trenches is connected a whole, it is necessary to form the fourth trenches, each in the middle of the position where each second trench is located, in order to form the word lines extending in the second direction. As shown in FIGS. 13A to 13D, the fourth trenches 190 separate the conductive material to form a structure of multiple word lines 180 in the second direction. Then the third isolation layers 191 may be formed by filling the fourth trenches 190 with an insulating material, for example by a deposition process such as CVD, ALD or PVD. In the dd' section shown in FIG. 13D, it can be seen that the third isolation layers 191 and the second isolation layers 170 are integrated when they are of the same material. It should be noted that the third isolation layers may be of the first insulating material or the second insulating material. If the third isolation layers are of the second insulating material, the third isolation layers are integrated with the second insulating layers and the top gate protection layers.

In this way, the gate conductive layers between two adjacent third isolation layers form a word line.

Figure 14:
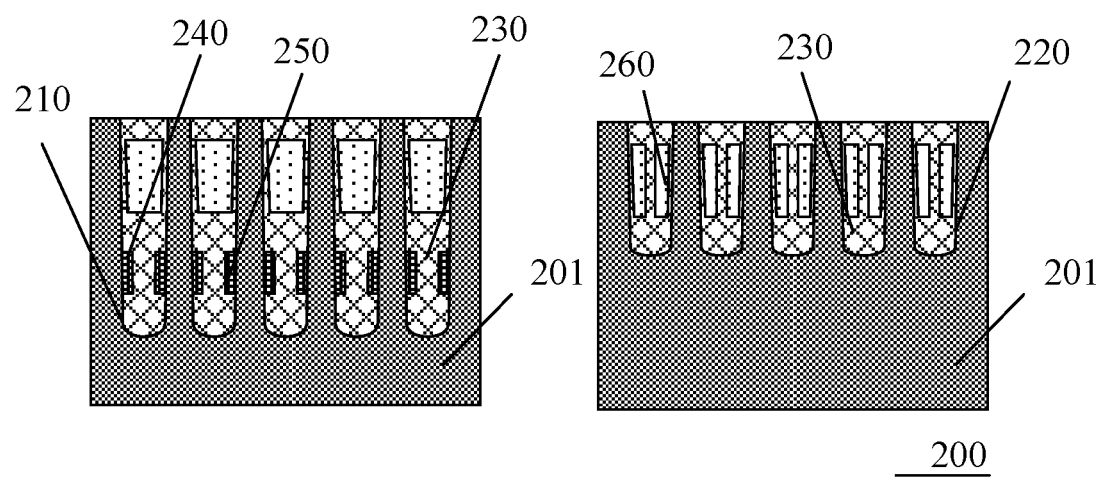
FIG. 14 is a scheme diagram of the structure of a semiconductor device provided by an embodiment of the disclosure.

As shown in FIG. 14 (FIG. 14 includes a cross-section in the first direction and a cross-section in the second direction), embodiments of the disclosure provide a semiconductor device 200 including: a substrate 201; a plurality of first trenches 210 extending in a first direction and a plurality of second trenches 220 extending in a second direction on the substrate 201, in which the first direction is perpendicular to the second direction, and a first depth of the first trenches 210 is greater than a second depth of the second trenches 220; first isolation layers 230, each located in each of the first trenches 210 and the second trenches 220, in which on a section in the second direction, first gaps 240 are respectively provided between each first isolation layer 230 and the sidewalls on both sides of each first trench 210, and a depth of the first gap 240 is less than the first depth; conductive layers 250 of a first conductive material is deposited at the bottoms of the first gaps 240 on both sides of each first trench 210, and the conductive layers form two bit lines 250 which are parallel to each other and extend in the first direction; and word lines 260 extending in the second direction formed above the conductive layers/bit lines 250 in the first trenches 210 and the second trenches 220.

In some embodiments, each of the first isolation layers includes: a first insulating layer at the bottom of each of the first trenches and the second trenches; and a second insulating layer on each of the first insulating layers, in which the first gaps are provided between the second insulating layer and the sidewalls on both sides of each of the first trenches.

In some embodiments, the first isolation layers and the conductive layers in the first gaps are covered with second isolation layers; and word lines extending in the second direction are provided above the second isolation layers.

In some embodiments, the semiconductor device further includes: gate oxide layers, each located on each of the second isolation layers and covering a sidewalls of each of the first trenches and the second trenches; the word lines, each including a gate conductive layer positioned between two adjacent ones of the gate oxide layers, and the gate conductive layers are connected with each other in the second direction; and third isolation layers provided between adjacent word lines.

The method for forming the structure of the semiconductor device has been described and exemplified in detail in the embodiments, and will not be repeated here.

It should be understood that "an embodiment" or "one embodiment" mentioned throughout the specification means that a particular feature, structure or characteristic associated with an embodiment is included in at least one embodiment of the disclosure. Thus, the words "in an embodiment" or "in one embodiment" presented throughout the specification do not necessarily refer to the same embodiment. In addition, the particular feature, structure or characteristic may be incorporated in one or more embodiments in any suitable manners. It should be understood that in the various embodiments of the disclosure, the serial numbers of the above-mentioned processes does not mean the order of implementation, and the implementation order of each process should be determined by its function and inherent logic, and the serial numbers should not constitute any limitation on the implementation process of the embodiments of the disclosure. The serial numbers of the above-mentioned embodiments of this disclosure are for description only, and do not represent the advantages or disadvantages of the embodiments.

It should be noted that, in this text, the terms "include", "comprise" or any other variations thereof are intended to encompass non-exclusive inclusion, so that a process, method, article or device that includes a set of elements not only includes those elements, but also includes other elements that are not explicitly listed, or also includes an element inherent to such process, method, article or device. In the absence of further limitations, an element defined by the phrase "includes an element" does not exclude the existence of another identical element in the process, method, article or device including the element.

In the embodiments provided by the disclosure, it should be understood that the disclosed devices and methods may be implemented in other ways. The embodiments of the device described above are only schematic. For example, the division of a unit is only a logical function division, and there may be another division mode in actual implementation, such as: multiple units or components can be combined, or integrated into another system, or some features can be ignored or not executed. In addition, the coupling, or direct coupling, or communication connection between the various components shown or discussed may be indirect coupling or communication connection between devices or units through some interfaces, and may be electrical, mechanical, or other form.

The units described above as separate components may or may not be physically separated, and the components displayed as units may or may not be physical units. It can be located in one place or distributed to multiple network units. Based on the actual needs, some or all of the units can be selected to achieve the purpose of this embodiment solution.

In addition, each functional unit in each embodiment of the disclosure may be all integrated into one processing unit, each unit may be individually used as one unit, or two or more units may be integrated into one unit. The integrated unit can be realized either in the form of hardware or in the form of hardware plus software functional unit.

The above is only an embodiment of the disclosure, but the scope of protection of the disclosure is not limited thereto. Any skilled person familiar with the technical field can easily conceive of changes or substitutions within the technical scope of the disclosure, which should be covered within the scope of protection of the disclosure. Therefore, the scope of protection of this disclosure shall be subject to the scope of protection of the claims.

INDUSTRIAL PRACTICALITY

Technical solution provided by the embodiments of the disclosure, in the manufacturing process of the semiconductor device, the bit line structures buried in the substrate are formed by forming trenches on the substrate, forming the first isolation layers with the first gaps between each of the first isolation layer and the sidewalls on both sides of each of the first trenches in the trenches, and then depositing the conductive material in the first gaps on both sides of the first trenches. Therefore, on the one hand, compared with a bit line formed by doping the semiconductor substrate, the bit line formed by depositing the conductive material adopted in the embodiments of the disclosure has higher conductivity, so that the overall performance of the semiconductor device can be improved. On the other hand, the integration level of the semiconductor device can be improved and the parasitic capacitance between the bit lines can be reduced by forming a parallel double-bit line structure in the first gaps on both sidewalls of each of the first trenches.

The invention claimed is:

1. A method for manufacturing a semiconductor device, in which the semiconductor device comprises a substrate, wherein the method comprises:
    forming a plurality of first trenches extending in a first direction on the substrate;
    forming a plurality of second trenches extending in a second direction on the substrate which the first trenches are formed on, wherein the first direction is perpendicular to the second direction, and a first depth of the first trenches is greater than a second depth of the second trenches;
    forming a first isolation layer in at least one of the first trenches and at least one of the second trenches, wherein on a section along the second direction, first gaps are respectively provided between the first isolation layer and sidewalls on both sides of the first trench, and a depth of the first gaps is less than the first depth;
    forming two bit lines which are parallel to each other and extend in the first direction by depositing conductive layers of a first conductive material at bottoms of the first gaps on both sides of the first trench; and
    forming word lines extending in the second direction in the first trench and the second trench, and above the conductive layers in the first trench.

2. The method according to claim 1, wherein forming the plurality of the second trenches extending in the second direction on the substrate on which the first trenches are formed comprises:
    forming a first insulating layer by covering a surface of the substrate with a first insulating material, wherein the first insulating layer covers the inner walls of the first trench;
    forming a second insulating layer by filling a second insulating material in the first trench; and forming a plurality of the second trenches extending in the second direction on the substrate.

3. The method according to claim 2, wherein forming the first isolation layer in at least one of the first trenches and at least one of the second trenches comprises:
filling the first insulating material in the second trench; and
forming the first gaps by removing part of the first insulating material covering in the first trench and the second trench synchronously to a position with a depth less than a third depth, wherein the third depth is less than the first depth and greater than the second depth, and the remaining first insulating layer and the second insulating layer in the first trench and the second trench constitute the first isolation layer.

4. The method according to claim 3, wherein after filling the first insulating material in the second trench, the method further comprises:
removing the first insulating material to a fourth depth to form a recessed area, wherein the fourth depth is less than the second depth; and
covering the sidewalls of the recessed area with the second insulating material to form protective layers,
wherein the first gaps formed after removing the first insulating material are located between the protective layers and the remaining first insulating layer in a direction perpendicular to the surface of the substrate.

5. The method according to claim 3, wherein forming the first gaps by removing part of the first insulating material covering in the first trench and the second trench synchronously to the position with the depth less than the third depth comprises:
removing part of the first insulating material by wet etching to form the first gaps.

6. The method according to claim 5, wherein the first insulating material comprises a silicon nitride material, and an etching solution used in the wet etching comprises a phosphoric acid solution.

7. The method according to claim 2, wherein forming the first insulating layer by covering the surface of the substrate with the first insulating material comprises:
depositing the first insulating material on the surface of the substrate by an atomic layer deposition process to form the first insulating layer.

8. The method according to claim 2, wherein after forming the second insulating layer by filling the second insulating material in the first trench, the method further comprises:
planarizing the second insulating layer and the first insulating layer on the surface of the substrate to expose the surface of the substrate other than areas of the first trenches and the second trenches.

9. The method according to claim 1, wherein forming the two bit lines which are parallel to each other and extend in the first direction by depositing conductive layers of the first conductive material at bottoms of the first gaps on both sides of the first trench comprises:
filling the first conductive material in the first gaps; and
removing part of the first conductive material in each of the first gaps, and retaining the first conductive material at the bottoms of the first gaps to form the bit lines, wherein the first conductive material at the bottoms constitutes the conductive layers.

10. The method according to claim 1, wherein forming the word lines extending in the second direction in the first trench and the second trench, and above the conductive layers in the first trench comprises:

forming third trenches by removing part of the first isolation layer which is located in the first trench and the second trench above the conductive layers;
forming a second isolation layer at a bottom of each of the third trenches, wherein a bottom of the second isolation layer is connected with the remaining first isolation layer between the two bit lines in the first trench, and a top of the second isolation layer is lower than the surface of the substrate of areas other than the first trenches and the second trenches; and
forming the word lines in the third trenches above the second isolation layer.

11. The method according to claim 10, wherein forming the word lines in the third trenches above the second isolation layer comprises:
forming gate oxide layers on the sidewalls of the first trench and the second trench above the second isolation layer;
filling a second conductive material between adjacent gate oxide layers to form gate conductive layers;
forming a fourth trench in the second conductive material in the second direction, wherein the fourth trench separate the gate conductive layers in a section in the first direction; and
filling the first insulating material into the fourth trench to form a third isolation layer, wherein the second conductive material on both sides of the third isolation layer connecting the gate conductive layers constitutes the word lines.

12. A semiconductor device comprising:
a substrate;
a plurality of first trenches extending in a first direction and a plurality of second trenches extending in a second direction on the substrate, wherein the first direction is perpendicular to the second direction, and a first depth of the first trenches is greater than a second depth of the second trenches;
a first isolation layer located in at least one of the first trenches and at least one of the second trenches, wherein on a section in the second direction, first gaps are respectively provided between the first isolation layer and sidewalls on both sides of the first trench, and a depth of the first gaps is less than the first depth;
conductive layers of a first conductive material deposited at bottoms of the first gaps on both sides of the first trench, wherein the conductive layers constitute two bit lines which are parallel to each other and extend in the first direction; and
word lines extending in the second direction in the first trench and the second trench, and above the conductive layers provided in the first trench.

13. The semiconductor device of claim 12, wherein the first isolation layer comprises:
a first insulating layer at a bottom of the first trench and the second trench; and
a second insulating layer on the first insulating layer,
wherein the first gaps are provided between the second insulating layer and the sidewalls on both sides of the first trench.

14. The semiconductor device of claim 13, wherein the first isolation layer and the conductive layers in the first gaps are covered with a second isolation layer; and
the word lines extending in the second direction are above the second isolation layer.

15. The semiconductor device of claim 14, further comprising:
- gate oxide layers, located above the second isolation layer and covering sidewalls of the first trench and the second trench;
- the word lines, each comprising gate conductive layers located between two adjacent ones of the gate oxide layers, and the gate conductive layers are connected in the second direction; and
- a third isolation layer provided between two adjacent ones of the word lines.

* * * * *